(12) United States Patent
Eid et al.

(10) Patent No.: US 10,840,430 B2
(45) Date of Patent: Nov. 17, 2020

(54) PIEZOELECTRIC PACKAGE-INTEGRATED SENSING DEVICES

(71) Applicant: Intel Corporation, Santa Clara, CA (US)

(72) Inventors: Feras Eid, Chandler, AZ (US); Sasha N. Oster, Chandler, AZ (US); Georgios C. Dogiamis, Chandler, AZ (US); Shawna M. Liff, Scottsdale, AZ (US); Adel A. Elsherbini, Chandler, AZ (US); Thomas L. Sounart, Chandler, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 810 days.

(21) Appl. No.: 15/199,894

(22) Filed: Jun. 30, 2016

(65) Prior Publication Data

US 2018/0006208 A1    Jan. 4, 2018

(51) Int. Cl.
| | |
|---|---|
| H01L 41/113 | (2006.01) |
| G06F 1/16 | (2006.01) |
| B81C 1/00 | (2006.01) |
| H01L 41/16 | (2006.01) |

(52) U.S. Cl.
CPC ...... *H01L 41/1136* (2013.01); *B81C 1/00476* (2013.01); *G06F 1/1633* (2013.01); *G06F 1/1694* (2013.01); *H01L 41/1132* (2013.01); *H01L 41/16* (2013.01); *B81B 2201/0235* (2013.01); *B81B 2207/012* (2013.01); *G06F 2200/1637* (2013.01)

(58) Field of Classification Search
CPC .................................................. H01L 41/1136
USPC ......................................................... 73/504.12
See application file for complete search history.

(56) References Cited

U.S. PATENT DOCUMENTS

| | | | |
|---|---|---|---|
| 2005/0193822 A1* | 9/2005 | Amano | G01L 1/16 73/704 |
| 2008/0314149 A1* | 12/2008 | Rueger | G01H 11/00 73/579 |
| 2012/0057216 A1* | 3/2012 | Flores | B81C 1/00476 359/290 |
| 2014/0007682 A1 | 1/2014 | Kabasawa et al. | |

(Continued)

OTHER PUBLICATIONS

International Preliminary Report on Patentability for International Patent Application No. PCT/US17/32946, dated Jan. 10, 2019, 11 pages.

(Continued)

*Primary Examiner* — Paul M. West
*Assistant Examiner* — Mark A Shabman
(74) *Attorney, Agent, or Firm* — Schwabe, Williamson & Wyatt, P.C.

(57) ABSTRACT

Embodiments of the invention include a sensing device that includes a base structure having a proof mass that is positioned in proximity to a cavity of an organic substrate, a piezoelectric material in contact with a first electrode of the base structure, and a second electrode in contact with the piezoelectric material. The proof mass deflects in response to application of an external force or acceleration and this deflection causes a stress in the piezoelectric material which generates a voltage differential between the first and second electrodes.

22 Claims, 6 Drawing Sheets

(56) References Cited

U.S. PATENT DOCUMENTS

| | | | |
|---|---|---|---|
| 2014/0159547 A1* | 6/2014 | Jun .................. | H02N 2/186 |
| | | | 310/339 |
| 2014/0299572 A1 | 10/2014 | Bibl et al. | |
| 2015/0215706 A1 | 7/2015 | Sparks et al. | |
| 2016/0050506 A1 | 2/2016 | Kim | |
| 2016/0090300 A1 | 3/2016 | Tsai et al. | |

OTHER PUBLICATIONS

International Search Report and Written Opinion from PCT/US2017/032946 dated Aug. 17, 2017, 14 pgs.

Office Action from Taiwan Patent Application No. 106116366, dated Jul. 21, 2020, 10 pages.

* cited by examiner

PIEZOELECTRIC PACKAGE-INTEGRATED SENSING DEVICES

FIELD OF THE INVENTION

Embodiments of the present invention relate generally to package integrated sensing devices. In particular, embodiments of the present invention relate to piezoelectric package integrated sensing devices (e.g., accelerometers).

BACKGROUND OF THE INVENTION

A variety of different types of sensors are being used in portable and mobile devices. Accelerometers are an integral part of many of today's computing platforms such as tablets, smartphones, wearables, internet of things (IoT), and even client devices like some laptops. Most of those sensors are manufactured using silicon-based MEMS approaches and are then packaged and assembled onto the package or board as a discrete part. Those sensor packages are typically tall (~1 mm in height) which can be challenging to accommodate in certain platforms where a thin form factor is desired. Moreover, the sensing devices are manufactured at wafer-level using expensive materials (such as silicon) and require assembly after packaging, which adds to the overall system cost.

DETAILED DESCRIPTION OF THE INVENTION

Figure 1:
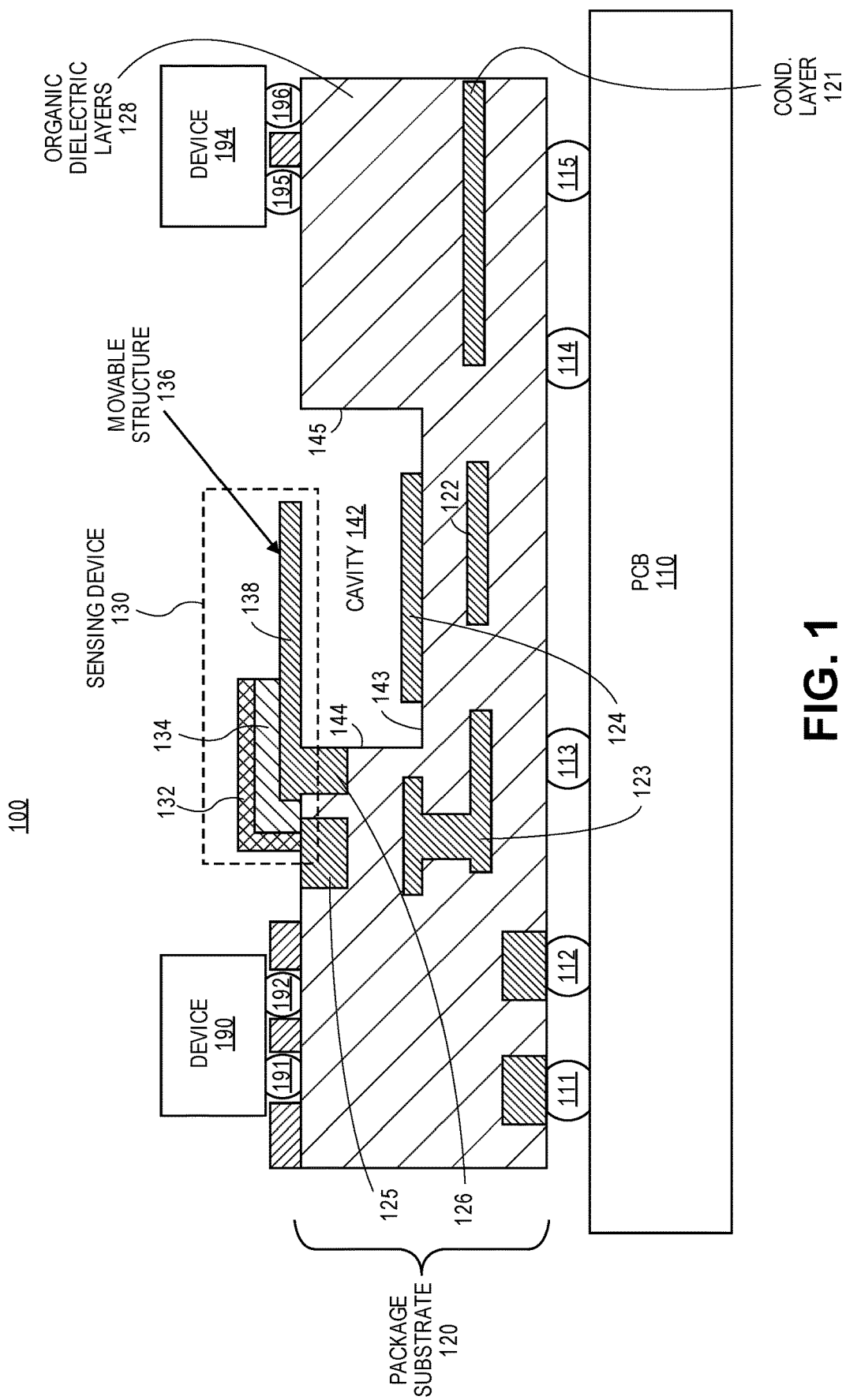
FIG. 1 illustrates a view of a microelectronic device 100 having a package-integrated piezoelectric sensing device, according to an embodiment.

Described herein are piezoelectric package integrated sensing devices. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order to not obscure the illustrative implementations.

Various operations will be described as multiple discrete operations, in turn, in a manner that is most helpful in understanding the present invention. However, the order of description should not be construed to imply that these operations are necessarily order dependent. In particular, these operations need not be performed in the order of presentation.

Most sensors currently utilize silicon-based micro-electromechanical system (MEMS) approaches. The MEMS sensors are packaged and assembled onto the processor package or board as a discrete part. Those sensor packages are typically tall (~1 mm in height) which can be challenging to accommodate in certain platforms where a thin form factor is desired.

The present design includes an architecture that allows in-situ fabrication of sensing devices in a compact form factor on package substrates using organic panel-level (e.g., approximately 0.5 m×0.5 m sized panels) high volume manufacturing technology, without requiring the assembly of external bulky components or expensive Si MEMS fabrication.

The present design provides thin, low cost sensors (e.g., motion devices, accelerometers, proper acceleration (g-force) devices, single-axis devices, multi-axis accelerometers, etc.) that are manufactured as part of an organic package substrate traditionally used to route signals between the CPU or other die and the board. The accelerometers use a piezoelectric material to convert applied external accelerations into electrical signals whose magnitude is used by the processor to quantify the applied acceleration in any direction (e.g., x-axis, y-axis, z-axis data). Since the accelerometer is built as part of the package substrate, very thin and compact sensors are possible and the need for assembly of a discrete part is eliminated. In one example, the sensor package has a z-axis height of 100-300 microns. Moreover, since those sensors are built using organic panel-level substrate technology, they can be manufactured more cost effectively than using a Si wafer based approach. The present design also eliminates the need for a magnet which is required for some current electromagnetic approaches for sensors.

In one example, the present design includes package-integrated structures to act as sensing devices. Those structures are manufactured as part of the package layers and are made free to vibrate or move by removing the dielectric material around them. The structures include piezoelectric stacks that are deposited and patterned layer-by-layer into the package. The present design includes creating sensing devices in the package on the principle of suspended and vibrating structures. Etching of the dielectric material in the package occurs to create cavities. Piezoelectric material deposition (e.g., 0.5 to 1 um deposition thickness) and crystallization also occurs in the package substrate during the package fabrication process. An annealing operation at a substrate temperature range (e.g., up to 260 C) that is lower than typically used for piezoelectric material annealing allows crystallization of the piezoelectric material (e.g., lead zirconate titanate (PZT), potassium sodium niobate (KNN), aluminum nitride (AlN), zinc oxide (ZnO), etc) to occur during the package fabrication process without imparting thermal degradation or damage to the substrate layers. In one example, laser pulsed annealing occurs locally with respect to the piezoelectric material without damaging other layers of the package substrate (e.g., organic substrate) including organic layers.

Referring now to FIG. 1, a view of a microelectronic device 100 having package-integrated piezoelectric devices is shown, according to an embodiment. In one example, the microelectronic device 100 includes multiple devices 190 and 194 (e.g., die, chip, CPU, silicon die or chip, radio transceiver, etc.) that are coupled or attached to a package substrate 120 with solder balls 191-192, 195-196. The package substrate 120 is coupled or attached to the printed circuit board (PCB) 110 using, for example, solder balls 111 through 115.

The package substrate 120 (e.g., organic substrate) includes organic dielectric layers 128 and conductive layers 121-126. Organic materials may include any type of organic material such as flame retardant 4 (FR4), resin-filled polymers, prepreg (e.g., pre impregnated, fiber weave impregnated with a resin bonding agent) polymers, silica-filled polymers, etc. The package substrate 120 can be formed during package substrate processing (e.g., at panel level). The panels formed can be large (e.g., having in-plane (x, y) dimensions of approximately 0.5 meter by 0.5 meter, or greater than 0.5 meter, etc.) for lower cost. A cavity 142 is formed within the packaging substrate 120 by removing one or more layers (e.g., organic layers, dielectric layers, etc.) from the packaging substrate 120. The cavity 142 includes a lower member 143 and sidewalls 144-145. In one example, a piezoelectric vibrating device 130 (e.g., sensing device) is formed with conductive structures 132 and 136 (e.g., cantilevers, beams, traces, etc.) and piezoelectric material 134. The three structures 132, 134, and 136 form a stack. The conductive structure 132 can act as a first electrode and the conductive movable base structure 136 can act as a second electrode of the piezoelectric vibrating device. The cavity 142 can be air filled or vacuum filled. The conductive structure (movable base structure) 136 includes a proof mass 138. When an external acceleration is applied to the system, the proof mass experiences a force proportional to this acceleration, which causes it (along with the rest of the movable base structure) to deflect, generating a stress in the piezoelectric film. This stress produces a voltage differential between the two electrodes that is proportional to the applied acceleration. By measuring this voltage, the applied acceleration can be inferred by using, for example, a look up table.

Figure 2:
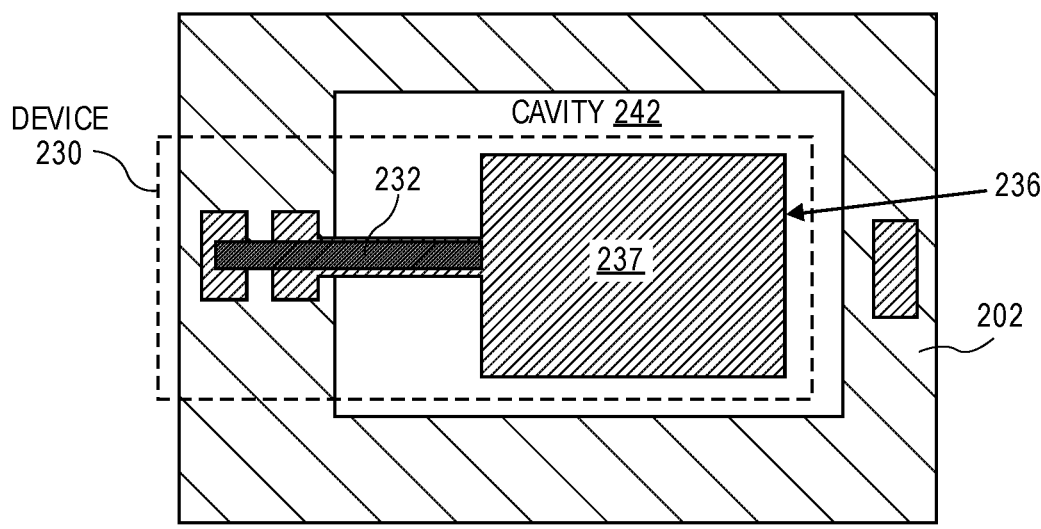
FIG. 2 illustrates a top view of a package substrate having a package-integrated piezoelectric sensing device, according to an embodiment.

FIG. 2 illustrates a top view of a package substrate having a package-integrated piezoelectric sensing device, according to an embodiment. In one example, the package substrate 200 may be coupled or attached to multiple devices (e.g., die, chip, CPU, silicon die or chip, RF transceiver, etc.) and may also be coupled or attached to a printed circuit board (e.g., PCB 110). The package substrate 200 (e.g., organic substrate) includes organic dielectric layers 202 and conductive layers 232 and 236. The package substrate 200 can be formed during package substrate processing (e.g., at panel level). A cavity 242 is formed within the packaging substrate 200 by removing one or more layers (e.g., organic layers, dielectric layers, etc.) from the packaging substrate 200. In one example, a piezoelectric device 230 (e.g., sensing device, accelerometer) is formed with conductive vibrating structures 232 and 236 and a piezoelectric material sandwiched between them. The conductive structure 232 can act as a top electrode and the conductive movable base structure 236 can act as a bottom electrode of the piezoelectric device. In one example, the piezoelectric material (not shown) is disposed on the bottom electrode and the top electrode is disposed on the piezoelectric material. The cavity 242 can be air filled or vacuum filled. The conductive structure 232 is anchored on one edge by package connections (e.g., anchors, vias) which may serve as both mechanical anchors as well as electrical connections to the rest of the package. The conductive structure 236 includes a proof mass 237 and is also anchored on one edge by package connections (e.g., anchors, vias) which may serve as both mechanical anchors as well as electrical connections to the rest of the package. In one example, a proof mass has dimensions in a plane of a package substrate of at least 100 microns and less than or equal to 5 mm.

Figure 3:
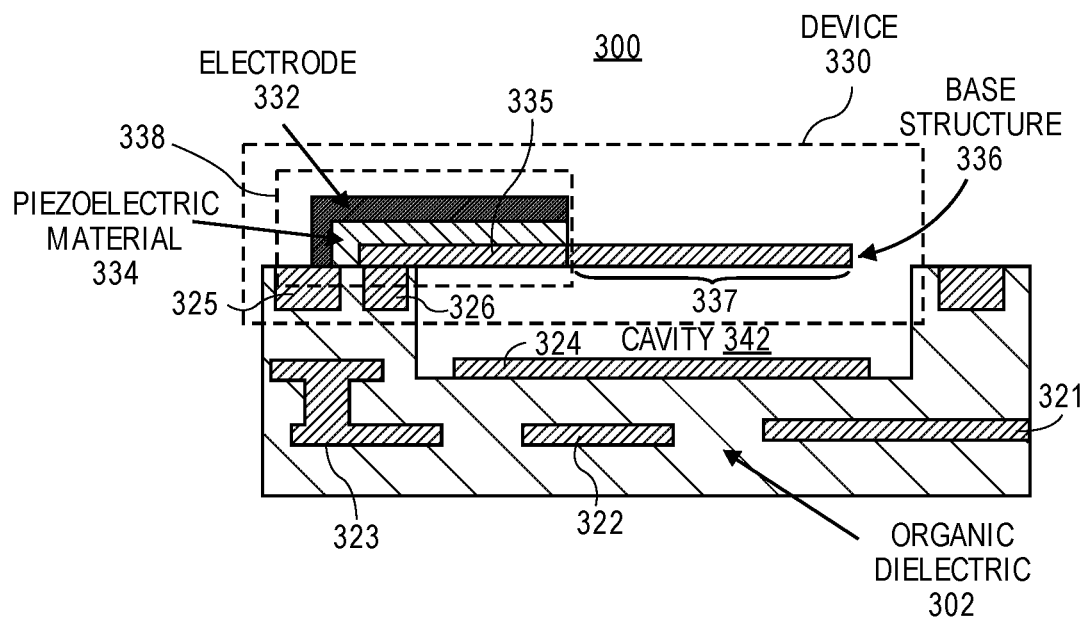
FIG. 3 illustrates a side view of a package substrate having a package-integrated piezoelectric device (e.g., sensing device), according to an embodiment.

FIG. 3 illustrates a side view of a package substrate having a package-integrated piezoelectric device (e.g., sensing device), according to an embodiment. The package substrate 300 (e.g., organic substrate) includes organic dielectric layers 302 (or layers 202) and conductive layers 321-326, 332, and 336. The package substrate 300 can be formed during package substrate processing (e.g., at panel level).

In one example, the package substrate 300 may be coupled or attached to multiple devices (e.g., die, chip, CPU, silicon die or chip, RF transceiver, etc.) and may also be coupled or attached to a printed circuit board (e.g., PCB 110). A cavity 342 is formed within the packaging substrate 300 by removing one or more layers (e.g., organic layers, dielectric layers, etc.) from the packaging substrate 300. In one example, a piezoelectric device 330 (e.g., sensing device, accelerometer) includes a piezoelectric stack 338 that is formed with conductive vibrating structures 332 and 336 and piezoelectric material 334. The conductive structure 332 can act as a top electrode and a region 335 of the conductive movable base structure 336 can act as a bottom electrode of the piezoelectric device. In one example, the piezoelectric material 334 is disposed on the bottom electrode and the top electrode is disposed on the material 334. The cavity 342 can be air filled or vacuum filled. The conductive structure 332 is anchored on one edge by package connections 325 (e.g., anchors, vias) which may serve as both mechanical anchors as well as electrical connections to the rest of the package. The conductive structure 336 includes a proof mass 337 and is also anchored on one edge by package connections 326 (e.g., anchors, vias) which may serve as both mechanical anchors as well as electrical connections to the rest of the package.

This structure 336 is surrounded by a cavity and is free to move in a direction (e.g., a vertical direction) when a mechanical excitation is applied. In another example, the structure is free to move in a different direction. The piezoelectric film 334 is mechanically attached to the base structure 336 and is sandwiched between the two conductive structures (electrodes), one of which can be the base structure itself. When an external acceleration is applied to the package substrate 300 (e.g., applied to a package substrate of a computing system), the proof mass 337 experiences a force proportional to this acceleration, which causes the proof mass (along with the rest of the base structure) to deflect. The deflection generates a stress in the piezoelectric film. This stress produces a voltage differential between the two electrodes 332 and 336 that is proportional to the applied acceleration. By measuring this voltage, the applied acceleration can be inferred, by using, for example, a look up table stored in a system memory of a microelectronic device.

The base structure 336 including the proof mass can be patterned as part of one of the substrate conductive trace layers and can include copper or another conductive material. Organic dielectric normally surrounds copper traces in packages/PCBs; however this organic material is removed around the base structure 336 in FIG. 3 to allow the base structure to move in response to applied force (e.g., acceleration). A piezoelectric stack 338 is deposited and patterned to convert the stress generated across the piezoelectric film 334 under external acceleration into a proportional voltage signal. The stack 338 includes a piezoelectric material 334 (e.g., PZT, KNN, ZnO, etc.) or other materials sandwiched between conductive electrodes. The base structure 336 itself can be used as one of the electrodes as shown in FIG. 3, or alternatively, a separate conductive material can be used as an electrode after depositing an insulating layer to electrically decouple this first electrode from the conductive membrane as illustrated in FIG. 4.

The package substrate 400 (e.g., organic substrate) includes organic dielectric layers 402 (or layers 402) and conductive layers 421-427, 432, 435, and 436. The package substrate 400 can be formed during package substrate processing (e.g., at panel level).

In one example, the package substrate 400 may be coupled or attached to multiple devices (e.g., die, chip, CPU, silicon die or chip, RF transceiver, etc.) and may also be coupled or attached to a printed circuit board (e.g., PCB 110). A cavity 442 is formed within the packaging substrate 400 by removing one or more organic dielectric layers 402 from the packaging substrate 400. In one example, a piezoelectric device 430 (e.g., sensing device, accelerometer) is formed with conductive vibrating structures 432, 435, and 436 and piezoelectric material 434. The conductive structure 432 can act as a top electrode and either a region 439 of the conductive movable base structure 436 or a separate structure 435 can act as a bottom electrode of the piezoelectric device. In one example, the piezoelectric material 434 is disposed on the bottom electrode and the top electrode is disposed on the material 434. The cavity 442 can be air filled or vacuum filled.

Figure 4:
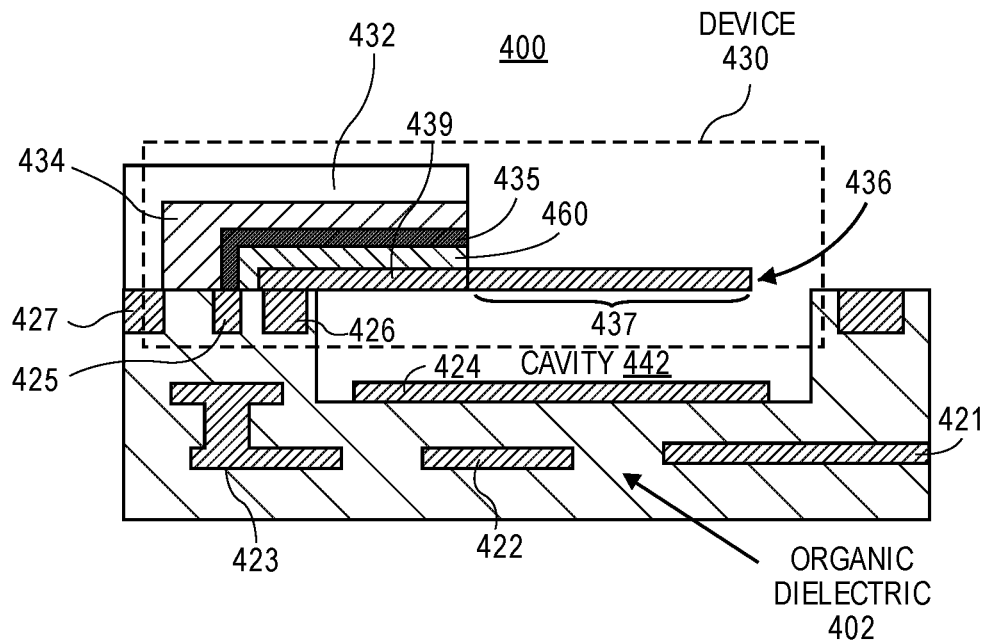
FIG. 4 illustrates a side view of a package substrate having a package-integrated piezoelectric device (e.g., sensing device), according to an embodiment.

If a different structure 435 is used as a bottom electrode, as shown in FIG. 4, then an insulating passivation layer 460 may optionally be deposited between the bottom electrode 435 and the movable structure 436. The layer 460 electrically isolates the structure 435 and the structure 436. The different layers are deposited and patterned sequentially as part of the fabrication process of the piezoelectric stack.

Although piezoelectric films typically require very high crystallization temperatures that are not compatible with organic substrates, the present design includes a process that allows the deposition and crystallization of high quality piezoelectric films without heating the organic layers to temperatures that would cause their degradation. This novel process enables the integration of piezoelectric films directly in the package substrate.

Figure 5:
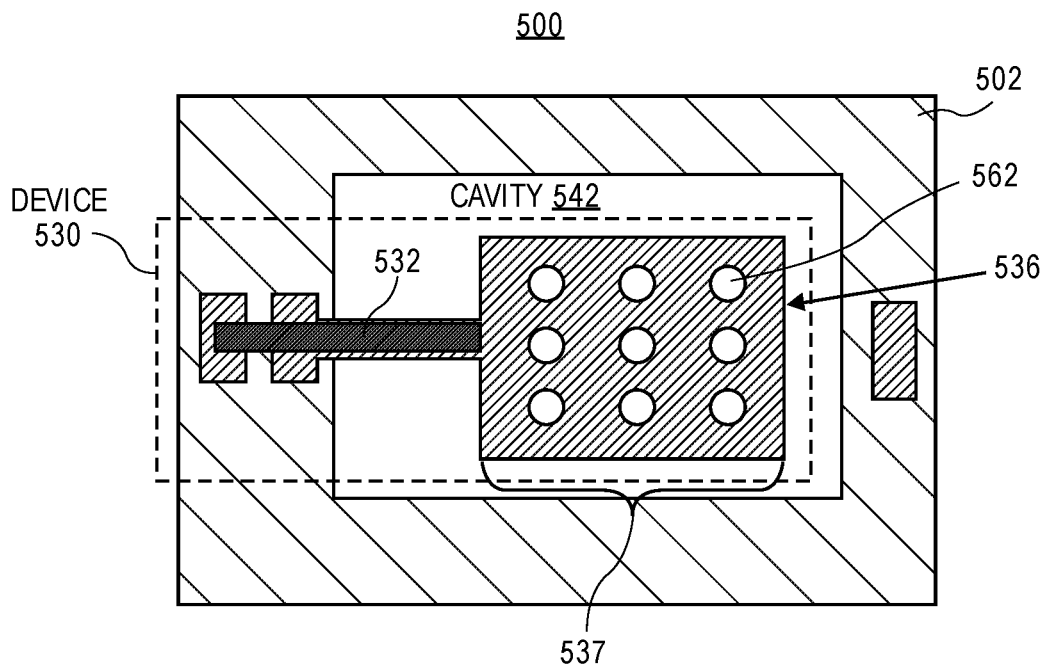
FIG. 5 illustrates a top view of a package substrate having a package-integrated piezoelectric device (e.g., sensing device), in accordance with one embodiment.

To assist in the organic material removal underneath the proof mass, etch holes can be incorporated as illustrated in a package substrate of FIG. 5 in accordance with one embodiment. The package substrate 500 (e.g., organic substrate) includes organic dielectric layers 502 (or layers 502) and conductive layers 532 and 536. The package substrate 500 can be formed during package substrate processing (e.g., at panel level). In one example, the package substrate 500 may be coupled or attached to multiple devices (e.g., die, chip, CPU, silicon die or chip, RF transceiver, etc.) and may also be coupled or attached to a printed circuit board (e.g., PCB 110). The package substrate 500 (e.g., organic substrate) includes organic dielectric layers 502 and conductive layers 532 and 536. A cavity 542 is formed within the packaging substrate 500 by removing one or more layers (e.g., organic layers, dielectric layers, etc.) from the packaging substrate 500. In one example, a piezoelectric device 530 (e.g., sensing device, accelerometer) is formed with conductive vibrating structures 532 and 536 and piezoelectric material (not shown). The conductive structure 532 can act as a top electrode and the conductive movable base structure 536 can act as a bottom electrode of the piezoelectric device. In one example, the piezoelectric material is disposed on the bottom electrode and the top electrode is disposed on the piezoelectric material. The cavity 542 can be air filled or vacuum filled. The conductive structure 536 includes a proof mass 537 having holes 562. In one embodiment, the holes 562 allow an etch medium (e.g., plasma) to more easily access locations in the organic material underneath the proof mass that are far from the proof mass's edges. This can improve the etching rate and the processing throughput.

In an alternative embodiment, the proof mass may be connected to two or more beams on the sides instead of the single beam illustrated in FIG. 5. An example with a proof mass being connected to two beams is shown in FIG. 6.

Figure 6:
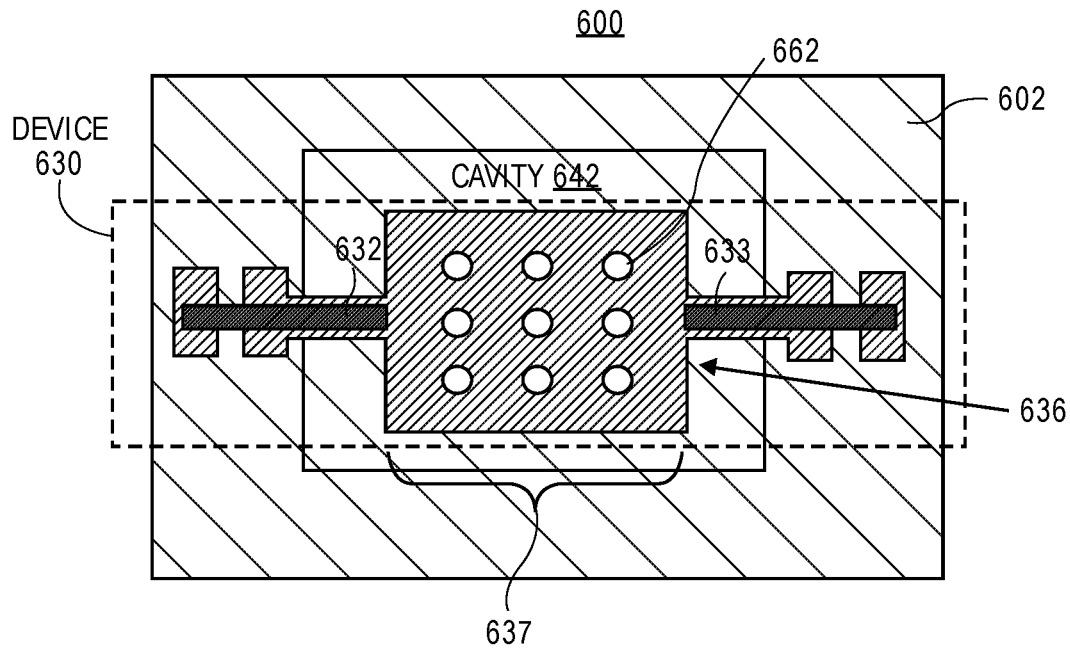
FIG. 6 illustrates a top view of a package substrate 600 (e.g., organic substrate) in accordance with one embodiment.

FIG. 6 illustrates a top view of a package substrate 600 (e.g., organic substrate) in accordance with one embodiment. The package substrate 600 includes organic dielectric layers 602 (or layers 602) and conductive layers 632, 633, and 636. The package substrate 600 can be formed during package substrate processing (e.g., at panel level). In one example, the package substrate 600 may be coupled or attached to multiple devices (e.g., die, chip, CPU, silicon die or chip, RF transceiver, etc.) and may also be coupled or attached to a printed circuit board (e.g., PCB 110). The package substrate 600 (e.g., organic substrate) includes organic dielectric layers 602 and conductive layers 632, 633, and 636. A cavity 642 is formed within the packaging substrate 600 by removing one or more layers (e.g., organic layers, dielectric layers, etc.) from the packaging substrate 600. In one example, a piezoelectric device 630 (e.g., sensing device, accelerometer) is formed with conductive vibrating structures 632, 633 and 636 and piezoelectric material (not shown). The conductive structures 632 and 633 can act as top electrodes and the conductive movable base structure 636 can act as a bottom electrode of the piezoelectric device. The cavity 642 can be air filled or vacuum filled. The conductive structure 636 includes a proof mass 637 having holes 662. In one embodiment, the holes 662 allow an etch medium (e.g., plasma) to more easily access locations in the organic material underneath the proof mass that are far from its edges. This can improve the etching rate and the processing throughput.

Figure 7:
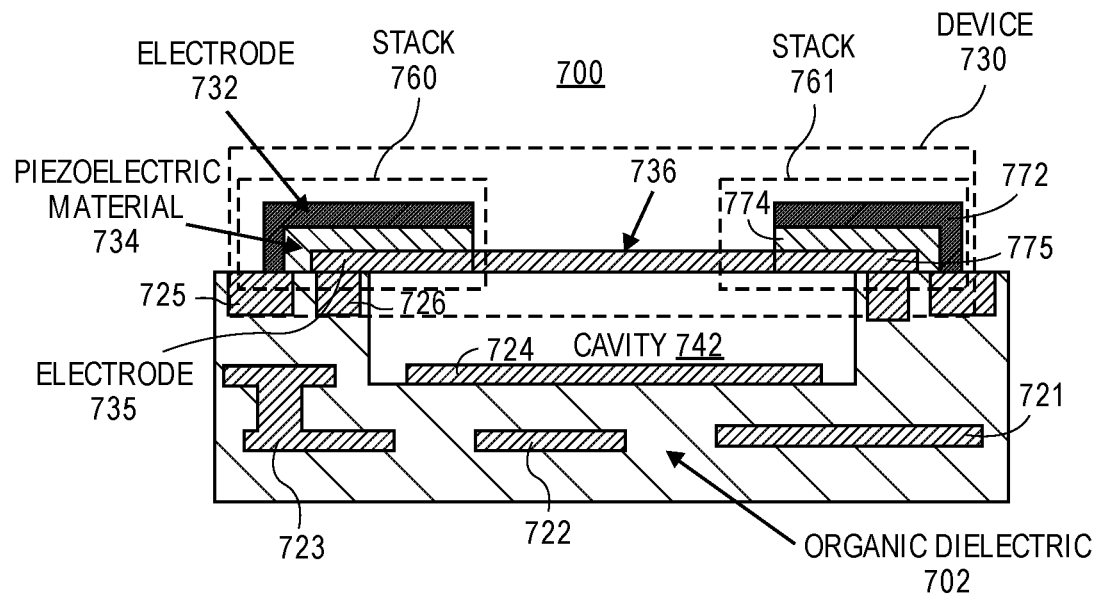
FIG. 7 illustrates a side view of a package substrate 700 (e.g., organic substrate) in accordance with one embodiment.

FIG. 7 illustrates a side view of a package substrate 700 (e.g., organic substrate) in accordance with one embodiment. The package substrate 700 includes organic dielectric layers 702 (or layers 702) and conductive layers 721-726, 732, 736, and 772. The package substrate 700 can be formed during package substrate processing (e.g., at panel level). In one example, the package substrate 700 may be coupled or attached to multiple devices (e.g., die, chip, CPU, silicon die or chip, RF transceiver, etc.) and may also be coupled or attached to a printed circuit board (e.g., PCB 110). A cavity 742 is formed within the packaging substrate 700 by removing one or more layers (e.g., organic layers, dielectric layers, etc.) from the packaging substrate 700. In one example, a piezoelectric device 730 (e.g., sensing device, accelerometer) is formed with conductive vibrating structures 732, 772, and 736 and piezoelectric material 734 and 774. A piezoelectric stack 760 includes an electrode 732, a piezoelectric material 734, and a region 735 of the vibrating structure 736 that acts as an electrode (or another electrode can be patterned to act as an electrode). A piezoelectric stack 761 includes a conductive electrode 772, a piezoelectric material 774, and a region 775 of the vibrating structure 736 that acts as an electrode (or another electrode can be patterned to act as an electrode). The cavity 742 can be air filled or vacuum filled. The conductive structure 736 includes a proof mass 637 having holes 662 as illustrated in FIG. 6.

In one example, the conductive structure 736 deflects in response to application of an external force or acceleration and this deflection causes a stress in the piezoelectric material 734 which generates a first voltage differential between the electrodes 732 and 735. This first voltage differential is measured to determine an amount of the external force or acceleration.

The deflection of the conductive structure 736 in response to application of an external force or acceleration also causes a stress in the piezoelectric material 774 which generates a second voltage differential between the electrodes 772 and 775. This second voltage differential is measured to determine an amount of the external force or acceleration.

The conversion of a deflection to a voltage differential may inherently have noise. A noise level can be determined by comparing the first and second voltage differentials. A difference between the first and second voltage differentials can be used to calibrate the noise level.

Figure 8:
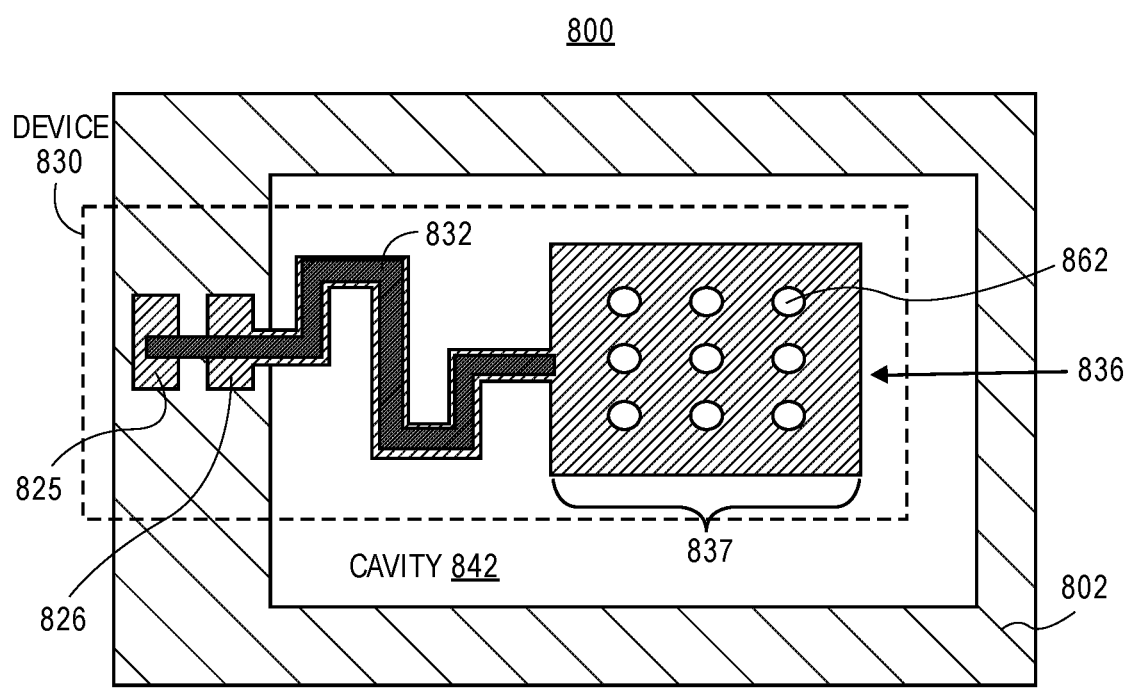
FIG. 8 illustrates a top view of a package substrate in accordance with one embodiment.

FIG. 8 illustrates a top view of a package substrate in accordance with one embodiment. The package substrate 800 (e.g., organic substrate) includes organic dielectric layers 802 (or layers 802) and conductive layers 825-826, 832, and 836. The package substrate 800 can be formed during package substrate processing (e.g., at panel level). In one example, the package substrate 800 may be coupled or attached to multiple devices (e.g., die, chip, CPU, silicon die or chip, RF transceiver, etc.) and may also be coupled or attached to a printed circuit board (e.g., PCB 110). A cavity 842 is formed within the packaging substrate 800 by removing one or more layers (e.g., organic layers, dielectric layers, etc.) from the packaging substrate 800. In one example, a piezoelectric device 830 (e.g., sensing device, accelerometer) is formed with conductive vibrating structures 832 and 836 and piezoelectric material. The conductive structure 832 can act as a top electrode and the conductive movable base structure 836 can act as a bottom electrode of the piezoelectric device. In one example, the piezoelectric material is disposed on the bottom electrode and the top electrode is disposed on the material. The cavity 842 can be air filled or vacuum filled. The conductive structure 836 includes a proof mass 837 having holes 862. The proof mass 837 may be connected to one or more curved or meandering beams of the structures 832 and 836 as illustrated in FIG. 8. The meandering beams may be used to engineer the structure 836 to have a specific stiffness in response to an applied external acceleration or force. This can in turn be used to control the amplitude of the electrical signal generated in the piezoelectric material.

The components (e.g., structures, proof masses, and cavities) illustrated in various figures of the present design generally have rectangular shapes though it is appreciated that these components can have any type of shape or configuration.

It will be appreciated that, in a system on a chip embodiment, the die may include a processor, memory, communications circuitry and the like. Though a single die is illustrated, there may be none, one or several dies included in the same region of the microelectronic device.

In one embodiment, the microelectronic device may be a crystalline substrate formed using a bulk silicon or a silicon-on-insulator substructure. In other implementations, the microelectronic device may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the scope of the present invention.

The microelectronic device may be one of a plurality of microelectronic devices formed on a larger substrate, such as, for example, a wafer. In an embodiment, the microelectronic device may be a wafer level chip scale package (WLCSP). In certain embodiments, the microelectronic device may be singulated from the wafer subsequent to packaging operations, such as, for example, the formation of one or more piezoelectric vibrating devices.

One or more contacts may be formed on a surface of the microelectronic device. The contacts may include one or more conductive layers. By way of example, the contacts may include barrier layers, organic surface protection (OSP) layers, metallic layers, or any combination thereof. The contacts may provide electrical connections to active device circuitry (not shown) within the die. Embodiments of the invention include one or more solder bumps or solder joints that are each electrically coupled to a contact. The solder bumps or solder joints may be electrically coupled to the contacts by one or more redistribution layers and conductive vias.

Figure 9:
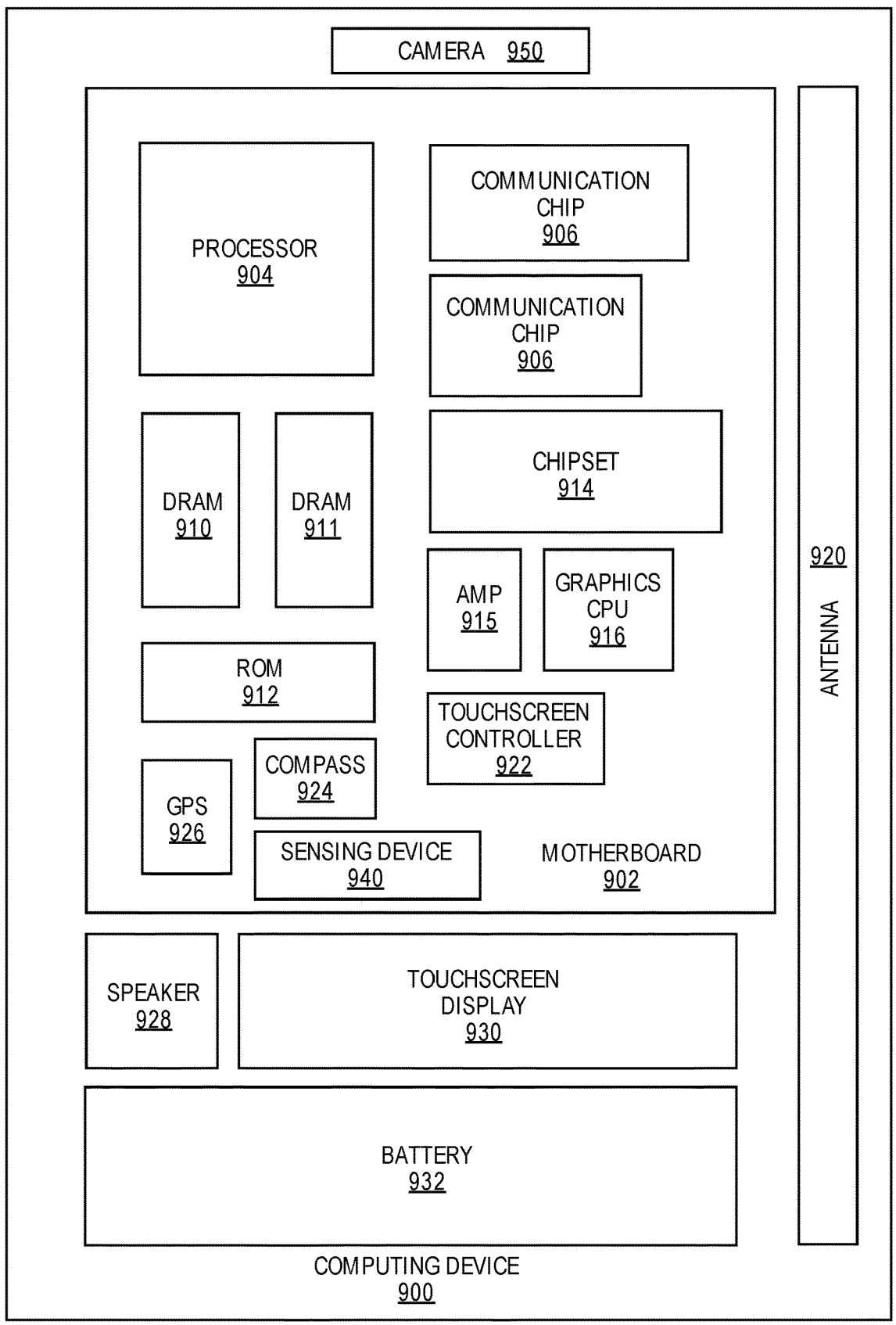
FIG. 9 illustrates a computing device 900 in accordance with one embodiment.

FIG. 9 illustrates a computing device 900 in accordance with one embodiment of the invention. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM 910, 911), non-volatile memory (e.g., ROM 912), flash memory, a graphics processor 916, a digital signal processor, a crypto processor, a chipset 914, an antenna 920, a display, a touchscreen display 930, a touchscreen controller 922, a battery 932, an audio codec, a video codec, a power amplifier 915, a global positioning system (GPS) device 926, a compass 924, a piezoelectric device 940 (e.g., a piezoelectric sensing device), a gyroscope, a speaker, a camera 950, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi, WiGig and Bluetooth and a second communication chip 906 may be dedicated to longer range wireless communications such as GPS, EDGE, GPRS, CDMA, WiMAX, LTE, Ev-DO, 5G, and others.

The processor 904 of the computing device 900 includes an integrated circuit die packaged within the processor 904. In some implementations of the invention, the processor package includes one or more devices, such as sensing devices in accordance with implementations of embodiments of the invention. The term "processor" may refer to any device or portion of a device that processes electronic data from registers and/or memory to transform that electronic data into other electronic data that may be stored in registers and/or memory. The communication chip 906 also includes an integrated circuit die packaged within the communication chip 906. The following examples pertain to further embodiments.

Example 1 is a sensing device comprising a base structure having a proof mass that is positioned in proximity to a cavity of an organic substrate, a piezoelectric material in contact with a first electrode of the base structure, and a second electrode in contact with the piezoelectric material. The proof mass deflects in response to application of an external force or acceleration and this deflection causes a stress in the piezoelectric material which generates a voltage differential between the first and second electrodes.

In example 2, the subject matter of example 1 can optionally include the sensing device being integrated with the organic substrate which is fabricated using panel level processing.

In example 3, the subject matter of any of examples 1-2 can optionally include the proof mass being positioned above a cavity of the organic substrate to allow deflection of the proof mass.

In example 4, the subject matter of any of examples 1-3 can optionally include the voltage differential between the first and second electrodes is measured to determine an amount of the external force or acceleration.

In example 5, the subject matter of any of examples 1-4 can optionally include the base structure comprising a released structure or cantilever.

In example 6, the subject matter of any of examples 1-5 can optionally include the proof mass having a plurality of holes to increase an etch rate of organic material of the organic substrate for forming the cavity.

In example 7, the subject matter of any of examples 1-6 can optionally include the first electrode being coupled to a first electrical connection of the organic substrate in proximity to a first end of a cavity of the organic substrate and the second electrode being coupled to a second electrical connection of the organic substrate in proximity to the first end of the cavity.

In example 8, the subject matter of any of examples 1-7 can optionally include the base structure comprises a third electrode that is coupled to a third electrical connection of the organic substrate in proximity to a second end of the cavity of the organic substrate and a fourth electrode that is coupled to a fourth electrical connection of the organic substrate in proximity to the second end of the cavity.

In example 9, the subject matter of any of examples 1-8 can optionally include the first electrode, the piezoelectric material, and the second electrode form a first piezoelectric stack, and wherein the third electrode, additional piezoelectric material, and the fourth electrode form a second piezoelectric stack.

In example 10, the subject matter of any of examples 1-9 can optionally include the base structure comprises the proof mass and a meandering beam which are positioned above the cavity.

Example 11 is a package substrate comprising a plurality of organic dielectric layers and a plurality of conductive layers to form the package substrate, a cavity formed in the package substrate, and a piezoelectric device integrated within the package substrate. The piezoelectric device includes a base structure having a proof mass that is positioned in proximity to the cavity, a piezoelectric material in contact with a first electrode and a second electrode. The proof mass deflects in response to application of an external force or acceleration and this deflection causes a stress in the piezoelectric material which generates a voltage differential between the first and second electrodes.

In example 12, the subject matter of example 11 can optionally include an insulating layer positioned between a region of the base structure and the first electrode.

In example 13, the subject matter of any of examples 11-12 can optionally include the piezoelectric device being integrated with the organic substrate which is fabricated using panel level processing.

In example 14, the subject matter of any of examples 11-13 can optionally include the proof mass being positioned above a cavity of the organic substrate to allow deflections of the proof mass.

In example 15, the subject matter of any of examples 11-14 can optionally include the voltage differential between the first and second electrodes being measured to determine an amount of the external force or acceleration.

In example 16, the subject matter of any of examples 11-15 can optionally include the base structure comprising a released structure or cantilever.

In example 17, the subject matter of any of examples 11-16 can optionally include the proof mass having a plurality of holes to increase an etch rate of the organic dielectric layers of the organic substrate for forming the cavity.

Example 18 is a computing device comprising at least one processor to process data and a package substrate coupled to the at least one processor. The package substrate includes a plurality of organic dielectric layers and a plurality of conductive layers to form the package substrate which includes a piezoelectric sensing device having a base structure with a proof mass that is positioned in proximity to a cavity of the package substrate, a piezoelectric material in contact with a first electrode of the base structure and a second electrode in contact with the piezoelectric material. The proof mass deflects in response to application of an external force or acceleration and this deflection causes a stress in the piezoelectric material which generates a voltage differential between the first and second electrodes.

In example 19, the subject matter of example 18 can optionally include the proof mass being positioned above the cavity of the package substrate to allow deflections of the proof mass. The voltage differential between the first and second electrodes is measured to determine an amount of the external force or acceleration.

In example 20, the subject matter of any of examples 18-19 can optionally include the sensing device being integrated with the organic package substrate having organic layers.

In example 21, the subject matter of any of examples 18-20 can optionally include a printed circuit board coupled to the package substrate.

The invention claimed is:

1. A sensing device, comprising:
a base structure having a unitary body, the unitary body comprising a proof mass and a first electrode, wherein the proof mass is positioned over a cavity of an organic substrate; and
a piezoelectric material in contact with a first electrode of the base structure, the piezoelectric material covering the first electrode and exposing the proof mass, and a second electrode in contact with the piezoelectric material, the second electrode covering the first electrode and exposing the proof mass, wherein the proof mass deflects in response to application of an external force or acceleration and this deflection causes a stress in the piezoelectric material which generates a voltage differential between the first and second electrodes.

2. The sensing device of claim 1, wherein the sensing device is integrated with the organic substrate which is fabricated using panel level processing.

3. The sensing device of claim 2, wherein the proof mass is positioned above a cavity of the organic substrate to allow deflection of the proof mass.

4. The sensing device of claim 2, wherein the voltage differential between the first and second electrodes is measured to determine an amount of the external force or acceleration.

5. The sensing device of claim 1, wherein the base structure comprises a released structure or cantilever.

6. The sensing device of claim 1, wherein the proof mass includes a plurality of holes to increase an etch rate of organic material of the organic substrate for forming the cavity.

7. The sensing device of claim 6, wherein the first electrode is coupled to a first electrical connection of the organic substrate in proximity to a first end of a cavity of the organic substrate and the second electrode is coupled to a second electrical connection of the organic substrate in proximity to the first end of the cavity.

8. The sensing device of claim 7, wherein the base structure comprises a third electrode that is coupled to a third electrical connection of the organic substrate in proximity to a second end of the cavity of the organic substrate and a fourth electrode that is coupled to a fourth electrical connection of the organic substrate in proximity to the second end of the cavity.

9. The sensing device of claim 8, wherein the first electrode, the piezoelectric material, and the second electrode form a first piezoelectric stack, and wherein the third electrode, additional piezoelectric material, and the fourth electrode form a second piezoelectric stack.

10. The sensing device of claim 1, wherein the base structure comprises the proof mass and a meandering beam which are positioned above the cavity.

11. A package substrate comprising:
a plurality of organic dielectric layers and a plurality of conductive layers to form the package substrate;
a cavity formed in the package substrate; and
a piezoelectric device integrated within the package substrate, the piezoelectric device including a base structure having a unitary body, the unitary body comprising a proof mass and a first electrode, wherein the proof mass is positioned over the cavity, a piezoelectric material in contact with a first electrode and a second electrode, the piezoelectric material covering the first electrode and exposing the proof mass, and the second electrode covering the first electrode and exposing the proof mass, wherein the proof mass deflects in response to application of an external force or acceleration and this deflection causes a stress in the piezoelectric material which generates a voltage differential between the first and second electrodes.

12. The package substrate of claim 11, wherein the piezoelectric device is integrated with the organic substrate which is fabricated using panel level processing.

13. The package substrate of claim 11, wherein the proof mass is positioned above a cavity of the organic substrate to allow deflections of the proof mass.

14. The package substrate of claim 11, wherein the voltage differential between the first and second electrodes is measured to determine an amount of the external force or acceleration.

15. The package substrate of claim 11, wherein the base structure comprises a released structure or cantilever.

16. The package substrate of claim 11, wherein the proof mass includes a plurality of holes to increase an etch rate of the organic dielectric layers of the organic substrate for forming the cavity.

17. A computing device comprising:
at least one processor to process data; and
a package substrate coupled to the at least one processor, the package substrate includes a plurality of organic dielectric layers and a plurality of conductive layers to form the package substrate which includes a piezoelectric sensing device having a base structure with a unitary body, the unitary body comprising a proof mass and a first electrode, wherein the proof mass is positioned over a cavity of the package substrate, a piezoelectric material in contact with a first electrode of the base structure, the piezoelectric material covering the first electrode and exposing the proof mass, and a second electrode in contact with the piezoelectric material, the second electrode covering the first electrode and exposing the proof mass, wherein the proof mass deflects in response to application of an external force or acceleration and this deflection causes a stress in the piezoelectric material which generates a voltage differential between the first and second electrodes.

18. The computing device of claim 17, wherein the proof mass is positioned above the cavity of the package substrate to allow deflections of the proof mass, and wherein the voltage differential between the first and second electrodes is measured to determine an amount of the external force or acceleration.

19. The computing device of claim 17, wherein the sensing device is integrated with the organic package substrate having organic layers.

20. The computing device of claim 17, further comprising: a printed circuit board coupled to the package substrate.

21. A sensing device, comprising:
a base structure having a proof mass that is positioned in proximity to a cavity of an organic substrate;

a piezoelectric material in contact with a first electrode of the base structure, and a second electrode in contact with the piezoelectric material, wherein the proof mass deflects in response to application of an external force or acceleration and this deflection causes a stress in the piezoelectric material which generates a voltage differential between the first and second electrodes, wherein the proof mass includes a plurality of holes to increase an etch rate of organic material of the organic substrate for forming the cavity, wherein the first electrode is coupled to a first electrical connection of the organic substrate in proximity to a first end of a cavity of the organic substrate and the second electrode is coupled to a second electrical connection of the organic substrate in proximity to the first end of the cavity, and wherein the base structure comprises a third electrode that is coupled to a third electrical connection of the organic substrate in proximity to a second end of the cavity of the organic substrate and a fourth electrode that is coupled to a fourth electrical connection of the organic substrate in proximity to the second end of the cavity.

22. The sensing device of claim 21, wherein the first electrode, the piezoelectric material, and the second electrode form a first piezoelectric stack, and wherein the third electrode, additional piezoelectric material, and the fourth electrode form a second piezoelectric stack.

* * * * *